(12) United States Patent
Kong

(10) Patent No.: US 7,550,812 B2
(45) Date of Patent: Jun. 23, 2009

(54) CAMERA MODULE AND METHOD OF FABRICATING THE SAME

(75) Inventor: Yung-cheol Kong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 11/806,584

(22) Filed: Jun. 1, 2007

(65) Prior Publication Data

US 2008/0073734 A1 Mar. 27, 2008

(30) Foreign Application Priority Data

Sep. 22, 2006 (KR) ...................... 10-2006-0092449

(51) Int. Cl.
*H01L 23/02* (2006.01)
(52) U.S. Cl. ........................ 257/432; 257/433; 257/618; 257/680; 257/684; 257/685; 257/E21.001
(58) Field of Classification Search ................. 257/432, 257/433, 618, 678, 684, 685, 724, 731
See application file for complete search history.

(56) References Cited

FOREIGN PATENT DOCUMENTS

| JP | 2002-372603 | 12/2002 |
| KR | 10-2004-0054525 | 6/2004 |
| KR | 10-2004-0068864 | 8/2004 |
| KR | 10-2005-0033987 | 4/2005 |

*Primary Examiner*—Evan Pert
*Assistant Examiner*—Tan N Tran
(74) *Attorney, Agent, or Firm*—Harness, Dickey & Pierce, PLC

(57) ABSTRACT

Example embodiments may provide a camera module including a high-resolution lens member and/or an image sensor chip that may be integrally formed, and a method of fabricating a camera module. Example embodiment camera modules may include a semiconductor package including an image sensor chip. A transparent substrate may include an upper plate portion and/or a supporting portion defined by a cavity under the upper plate portion, and the supporting portion may be attached on the semiconductor package. The upper plate portion may be spaced from the semiconductor package by the supporting portion. A lens member may be attached to the upper plate portion of the transparent substrate. A stop member may be formed on a top side of the transparent substrate and may expose a portion of the lens member.

10 Claims, 5 Drawing Sheets

CAMERA MODULE AND METHOD OF FABRICATING THE SAME

PRIORITY STATEMENT

This application claims priority under 35 U.S.C. § 119 to Korean Patent Application No. 10-2006-0092449, filed on Sep. 22, 2006, in the Korean Intellectual Property Office, the entire contents of which are incorporated herein by reference.

BACKGROUND

1. Field

Example embodiments may relate to an imaging device, for example, to a camera module including an image sensor chip and a method of fabricating a camera module.

2. Description of the Related Art

A camera module may be in an imaging device such as a mobile phone. A related art camera module may be assembled using a hollow barrel-shaped frame. A lens member and/or a semiconductor package including an image sensor chip may be assembled into a hollow barrel-shaped frame. An optical signal passing through the lens member may be converted into an electric signal by an image sensor chip. An electric signal may be converted into an image signal by an additional signal processor.

An imaging device such as a mobile phone may be increasingly miniaturized. In a related art camera module, a semiconductor package and/or a lens member may be separately prepared and assembled into a barrel shaped frame. It may be difficult to reduce the volume of the camera module. The large volume of a camera module may affect the miniaturization of an image device using a camera module. Manufacturing costs may increase because an assembling process may be required for the camera module.

As the number of pixels of an imaging device increase, a high-resolution lens may be required. As alignment sensitivity between a lens member and an image sensor chip increases and/or size of a camera module decreases, it may be difficult to assemble a camera module.

SUMMARY

Example embodiments may provide a camera module including a high-resolution lens member and/or an image sensor chip that may be integrally formed.

Example embodiments may provide a method of fabricating a wafer-level camera module.

Example embodiments may provide a camera module including a semiconductor package with an image sensor chip. A transparent substrate may include an upper plate portion and/or a supporting portion defined by a cavity under the upper plate portion, and a supporting portion may be attached on the semiconductor package. The upper plate portion may be spaced from the semiconductor package by the supporting portion. A lens member may be attached to an upper plate portion of the transparent substrate. A stop member may be on a top side of the transparent substrate and/or may expose a portion of the lens member.

The lens member may include a first lens attached to a bottom side of an upper plate portion of the transparent substrate and/or a second lens attached to a top side of an upper plate portion of the transparent substrate.

The stop member may be on sidewalls of the semiconductor package and/or the transparent substrate.

The camera module may include a filter member between the transparent substrate and the lens member.

Example embodiments may provide a method of fabricating a camera module. Example embodiment methods may involve a wafer level semiconductor package including a plurality of image sensor chips arrayed. A transparent substrate may be used. The transparent substrate may include an upper plate portion, a plurality of supporting portions, and/or a plurality of lower cavities that may determine shapes of the upper plate portion and/or the supporting portions as defined by a plurality of cavities under the upper plate portion. A plurality of lens members may be attached to the upper plate portion of the transparent substrate in alignment with the arrayed image sensor chips. The transparent substrate coupled with the lens members may be attached to the wafer level semiconductor package. The wafer level semiconductor package coupled with the transparent substrate may be separated along boundaries of the image sensor chips.

BRIEF DESCRIPTION OF THE DRAWINGS

The above and/or other features and advantages of example embodiments will become more apparent by describing in detail the attached drawings in which.

DETAILED DESCRIPTION

Figure 1:
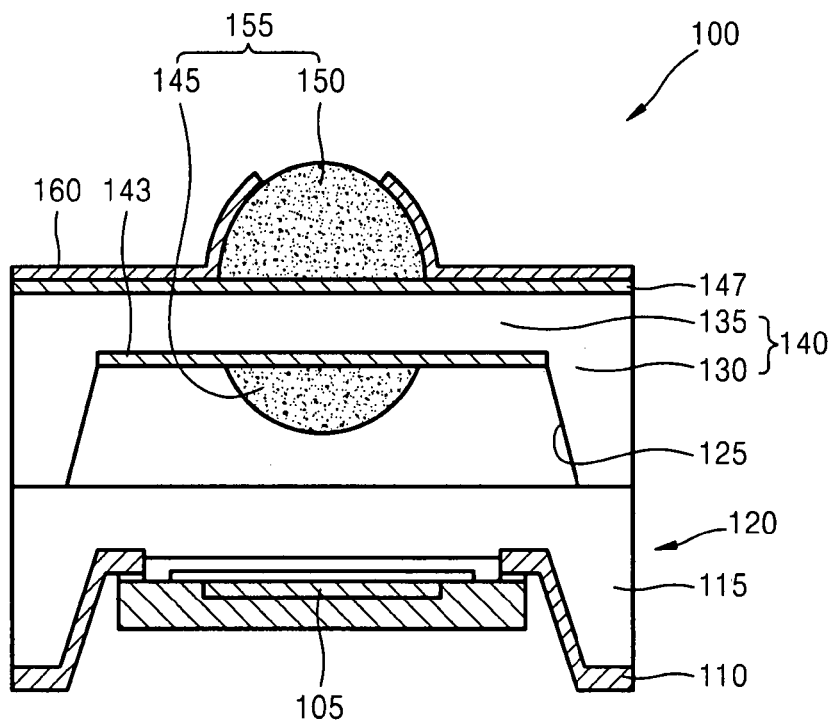
FIG. 1 is a cross-sectional view illustrating an example embodiment camera module.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," "electrically connected to," or "coupled to" another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments that may be illustrated in the accompanying drawings, wherein like reference numerals may refer to the like components throughout.

FIG. 1 is a cross-sectional view illustrating an example embodiment camera module 100.

As shown in FIG. 1, a semiconductor package 120 may include an image sensor chip 105 on a package substrate 115. The image sensor chip 105 may convert an optical signal received into an electric signal. For example, the image sensor chip 105 may include a complementary metal-oxide semiconductor (CMOS) device and/or a charge coupled device (CCD).

For example, the package substrate 115 may include a glass substrate. The semiconductor package 120 using a glass substrate may include a chip on glass (COG) configuration. The semiconductor package configuration illustrated in FIG. 1 is an example embodiment and not limited to the configuration illustrated in FIG. 1. For example, the semiconductor package 120 may include a chip scale package (CSP).

The image sensor chip 105 may be connected to a plurality of leads 110. The leads 110 may connect the image sensor chip 105 to an external device. The leads 110 may be connected to the image sensor chip 105 through a redistribution line (not shown). Depending on the type of the semiconductor package 120, the leads 110 may be replaced with other conductive members.

A transparent substrate 140 may be on the semiconductor package 120. For example, the transparent substrate 140 may include a supporting portion 130 and/or an upper plate portion 135. The supporting portion 130 may be attached to the semiconductor package 120 by an adhesive member. The shapes of the supporting portion 130 and/or the upper plate portion 135 may be defined by a lower cavity 125 of the transparent substrate 140. A portion of the transparent substrate 140 located above the cavity 125 may be the upper plate portion 135, and/or a portion of the transparent substrate 140 surrounding the cavity 125 may be the supporting portion 130 that supports the upper plate portion 135. The upper plate portion 135 may be spaced from an upper portion of the semiconductor package 120 by the supporting portion 130. For example, the transparent substrate 140 may include a glass substrate.

A lens member 155 is may be on the upper plate portion 135 of the transparent substrate 140. The lens member 155 may include a first lens 145 and/or a second lens 150. The first lens 145 may be attached to a bottom side of the upper plate portion 135, and/or the second lens 150 may be attached to a top side of the upper plate portion 135. The bottom side of the upper plate portion 135 may be a side from which the supporting portion 130 protrudes, and the top side may opposite the bottom side of the upper plate portion 135.

The first lens 145 may be in the cavity 125. The distance between the image sensor chip 105 and the lens member 155 may be the focal length of the camera module 100 and may be easily adjusted by varying the height of the supporting portion 130 of the transparent substrate 140. The first and/or second lenses 145 and 150 may include, for example, an ultraviolet (UV) curable polymer.

The first and second lenses 145 and/or 150 may be aspherical or spherical. The first lens 145 may be an aspherical lens and the second lens 150 may be a spherical lens, and vice versa. Both the first and second lenses 145 and 150 may be aspherical lenses or both may be spherical lenses. The first and second lenses 145 and 150 may have similar size or different sizes. Pixels of the lens member 155 may be increased or decreased by adjusting the number, size, and/or shape of the first and second lenses 145 and 150. In an example embodiment, one of the first and second lenses 145 and 150 may be omitted.

Filter members 143 and/or 147 may be formed between the first lens 145 and the bottom side of the upper plate portion 135 and/or between the second lens 150 and the upper side of the upper plate portion 135. The filter members 143 and 147 may block, for example, infrared rays. The filter members 143 and 147 may include a plurality of reflecting layers. The filter members 143 and 147 may be omitted and/or replaced with other effective members.

A stop member 160 may be formed on the transparent substrate 140 and may expose a portion of the lens member 155. The stop member 160 may expose a center portion of the second lens 150 formed on the upper plate portion 135 of the transparent substrate 140 and/or may cover the remaining portions of the second lens 150 and the upper plate portion 135. The stop member 160 may block light incident onto the second lens 150 in some directions. The stop member 160 may include a black material, for example, a photoresist layer, which may block light.

In an example embodiment camera module 100, the lens member 155, the filter members 143 and 147, and/or the stop member 160 may be stacked on each other on the transparent substrate 140, and the transparent substrate 140 may be attached to the semiconductor package 120. If compared with the structure of a conventional camera module in which components may be separately assembled, the camera module 100 may have a more integrated stack structure. In the example embodiment camera module 100, the lens member 155, the filter members 143 and 147, and the stop member 160 may be formed closely to each other, and the camera module 100 may have a smaller size.

In an example embodiment, the structure of the package substrate 115 may be similar to that of the transparent substrate 140. The package substrate 115 may be included in the semiconductor package 120, and the transparent substrate 140 may be on package substrate 115. The camera module 100 may be formed by stacking the package substrate 115 and the transparent substrate 140 that may have similar shapes. In another example embodiment, the semiconductor package 120 may be modified into various configurations.

In another example embodiment, the camera module 100 may have a configuration in which a plurality of transparent substrates 140 may be stacked on the semiconductor package 120. A number of lens members 155 may be adjusted, so that the pixel number of the camera module 100 may be controlled.

Figure 2:
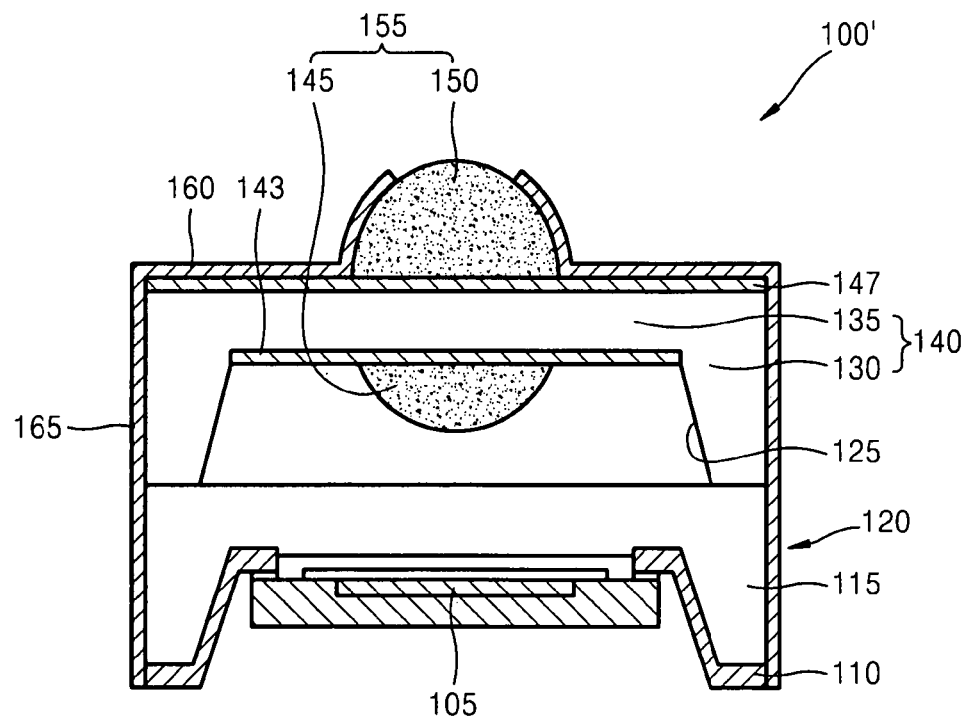
FIG. 2 is a cross-sectional view illustrating an example embodiment camera module.

FIG. 2 is a cross-sectional view illustrating an example embodiment camera module 100'. In FIGS. 1 and 2, like reference denote like elements. Descriptions of redundant elements may be omitted.

As shown in to FIG. 2, the camera module 100' may include stop members 160 and 165. The stop members 160 and 165 may be referred to as a first stop member and a second stop member, respectively. The second stop member 165 may covers sidewalls of a semiconductor package 120 and a transparent substrate 140. The second stop member 165 may prevent or reduce light from reaching an image sensor chip 105 through the sidewalls of the semiconductor package 120 and/ or the transparent substrate 140.

The second stop member 165 may include a black material, for example, photoresist, which may block light. The first and second stop members 160 and 165 may be formed of the same material and/or different materials. In the camera module 100', the first and second stop members 160 and 165 may block or reduce light coming from some directions.

FIGS. 3 through 12 are cross-sectional views illustrating an example embodiment method of fabricating a camera module.

Figure 3:
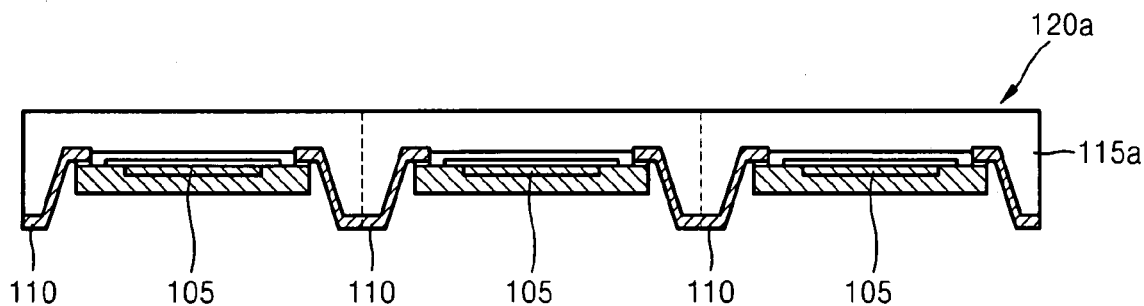
FIGS. 3 through 11 are cross-sectional views for explaining an example embodiment method of fabricating a camera module.

As shown in FIG. 3, a wafer level semiconductor package 120a may be used. The wafer level semiconductor package 120a may be formed by arranging the semiconductor package 120 illustrated in FIG. 1 in an array. A plurality of image sensor chips 105 may be arranged like a plurality of image sensor chips arranged on a wafer.

In the wafer level semiconductor package 120a, a package substrate 115a may be formed by arranging and/or connecting package substrates each having the same structure as the package substrates 115 illustrated in FIG. 1. The package substrate 115a may have a size corresponding to the size of a wafer and may be divided into sections each corresponding to the package substrate 115 of FIG. 1 as illustrated using dashed lines. Neighboring leads 110 may be connected or separated from each other.

Figure 4:
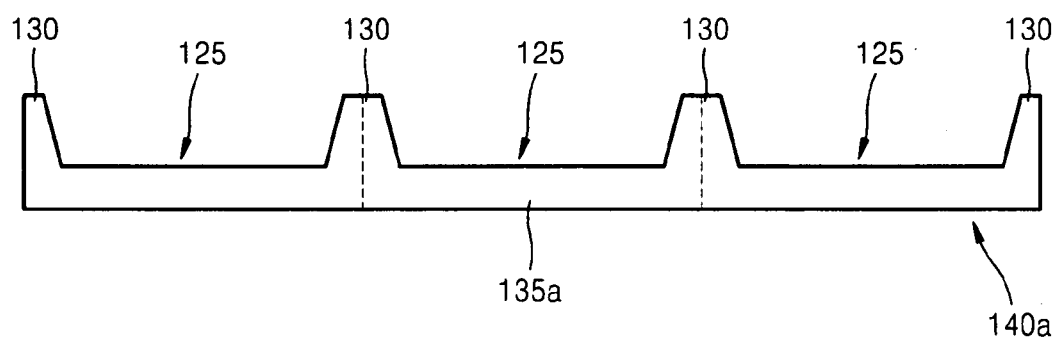

As shown in FIG. 4, a transparent substrate 140a may be used. The transparent substrate 140a may include an upper plate portion 135a, a plurality of supporting portions 130, and/or a plurality of cavities 125 defining the shapes of the upper plate portion 135a and/or the supporting portions 130. The transparent substrate 140a may be formed by arranging and/or connecting transparent substrates having the same structure as the transparent substrate 140 illustrated in FIG. 1. The transparent substrate 140a may have a size corresponding to a size of a wafer and/or may be divided into portions corresponding to the transparent substrate 140 of FIG. 1 as illustrated using dashed lines.

Figure 5:
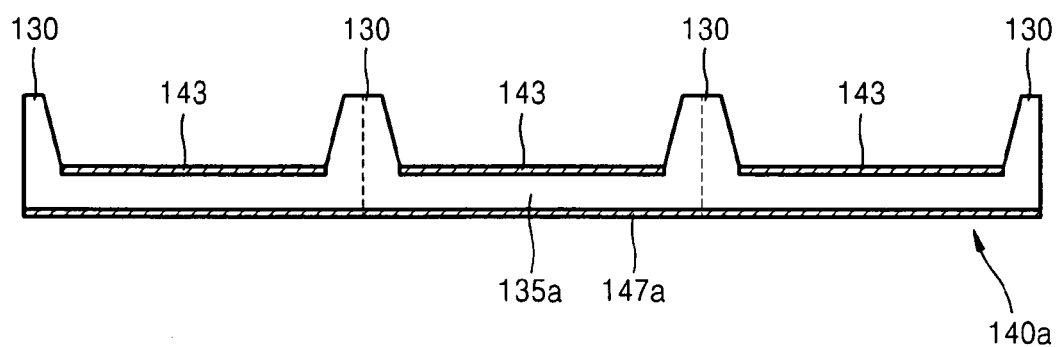

As shown in FIG. 5, filter members 143 and 147a may be formed on a bottom side and/or a top side of the upper plate portion 135a of the transparent substrate 140a. The filter members 143 and 147a may be formed by, for example, depositing and/or patterning a material layer.

Figure 6:
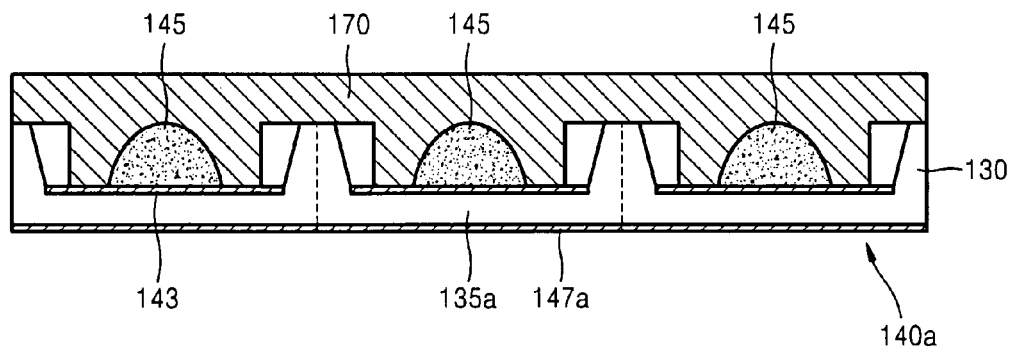
Figure 7:
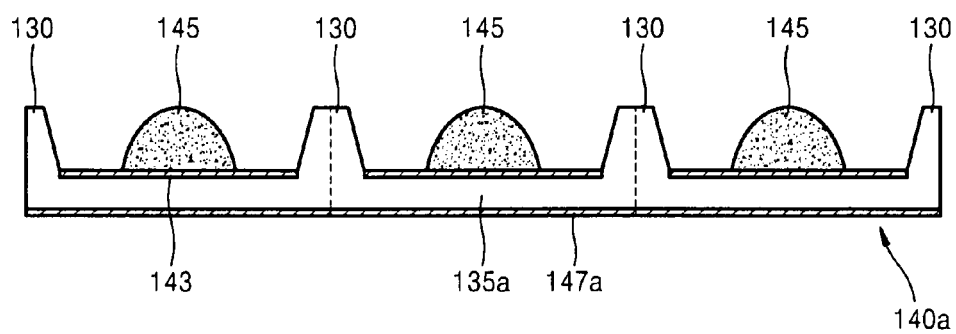

As shown in FIGS. 6 and 7, a plurality of first lenses 145 may be attached to a bottom side of the upper plate portion 135a of the transparent substrate 140a. A bottom side of the upper plate portion 135a may be exposed by the cavities 135 and formed with the supporting portions 130. A top side of the upper plate portion 135a may be located opposite to a bottom side of the upper plate portion 135a. The plurality of first lenses 145 may be in the cavities 125 of the transparent substrate 140a.

As shown in FIG. 6, lens-shaped islands can be formed on the filter members 143 using an UV curable polymer and/or a first mold 170. The lens-shaped islands may be hardened using UV rays so as to form the first lenses 145. Depending on the shape of the first mold 170, the first lenses 145 may have various shapes, for example, a substantially spherical shape or an aspherical shape. As shown in FIG. 7, the first mold 170 may be removed from the first lenses 145.

Figure 8:
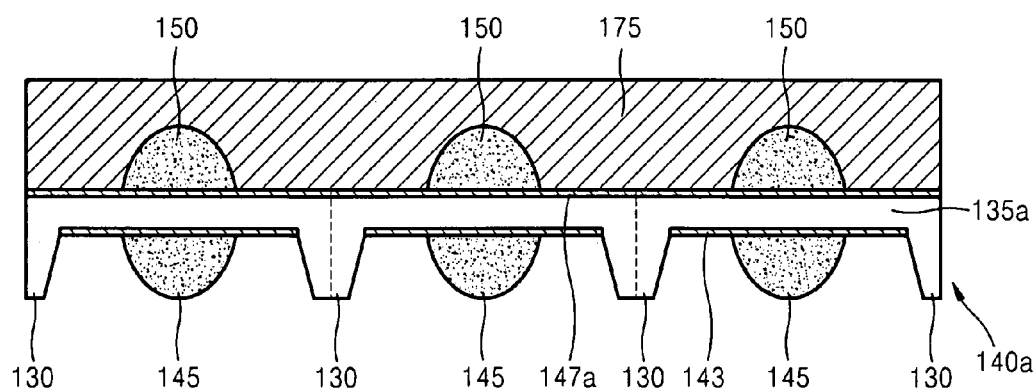
Figure 9:
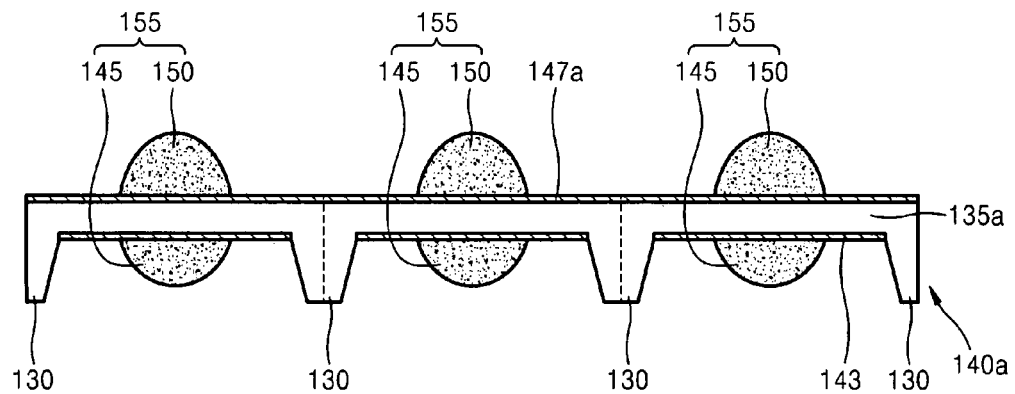

As shown in FIGS. 8 and 9, a plurality of second lenses 150 may be attached to a top side of the upper plate portion 135a of the transparent substrate 140a. As shown in FIG. 8, lens-shaped islands may be formed on the filter members 147a using an UV curable polymer and/or a second mold 175, and the lens-shaped islands may be hardened using UV rays so as to form the second lenses 150. As shown in FIG. 9, the second mold 175 may be removed from the second lenses 150.

A plurality of first and second lenses 145 and 150 may form a plurality of lens members 155. The first and second lenses 145 and 150 may have a similar shape or different shape depending on the shapes of the first and second molds 170 and 175. The first lenses 145 may be aspherical, and/or the second lenses 150 may be spherical, and vice versa.

Figure 10:
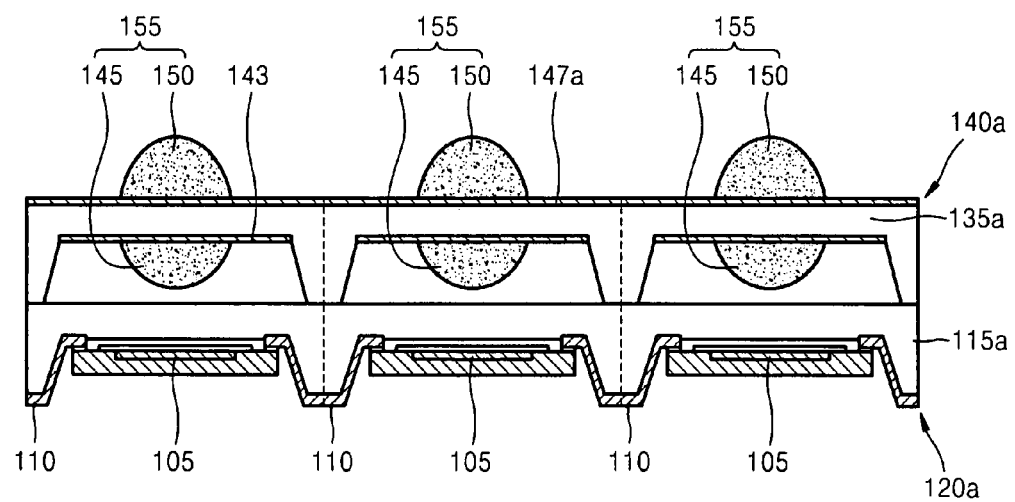

As shown in FIG. 10, the transparent substrate 140a on which the lens members 155 may be formed may be attached to the wafer level semiconductor package 120a. Bottom sides of the supporting portions 130 of the transparent substrate 140a and a top side of the package substrate 115a of the wafer level semiconductor package 120a may be attached to each other using an appropriate adhesive member.

Figure 11:
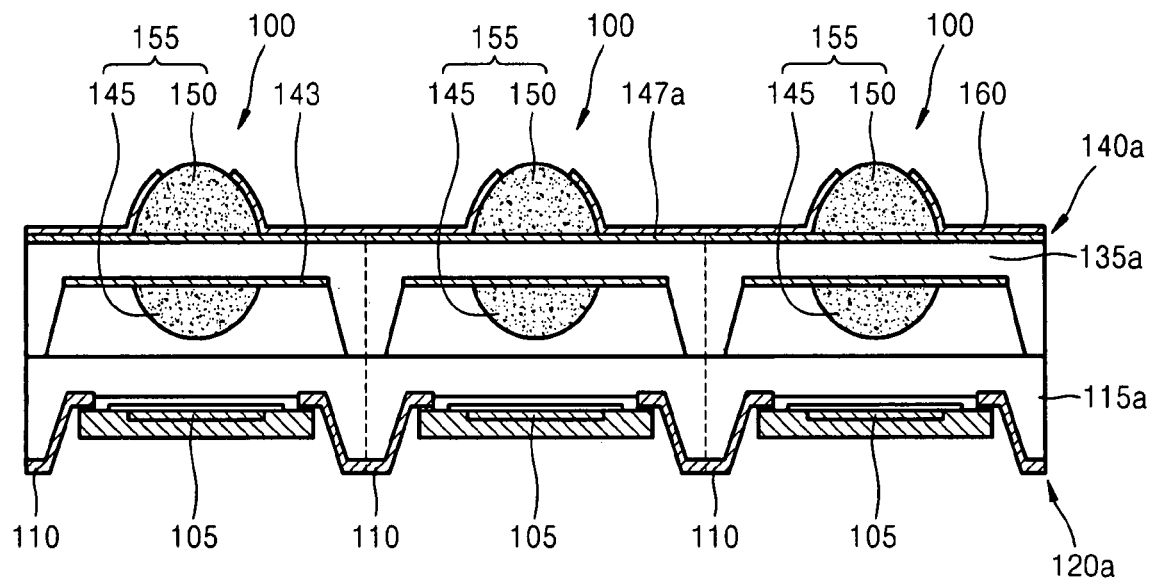

As shown in FIG. 11, a stop member 160 may be formed on the upper plate portion 135a of the transparent substrate 140a. The stop member 160 may expose portions of the lens members 155. The stop member 160 may be formed by coating the upper plate portion 135a using a black material, for example, photoresist, and patterning the black material.

The stacked structure of the transparent substrate 140a and the wafer level semiconductor package 120a may be separated along the boundaries of the image sensor chips 105. For example, dashed lines of FIG. 11 may be separating lines. A plurality of wafer-level camera modules 100 can be simultaneously formed.

Considering that the image sensor chips 105 may be fabricated at the wafer level, it may be necessary to fabricate the camera modules 100 at a wafer level. Manufacturing cost can be reduced by substantially simultaneously fabricating the camera modules 100 at a wafer level. Size of the camera modules 100 may be reduced by fabricating the camera modules 100 using wafer-level techniques instead of conventional assembling techniques. Because the wafer-level camera module 100 may have an integrated stacked structure, size of the wafer-level camera modules 100 may be reduced as compared with a conventional camera module in which components may be assembled at intervals. Because the camera module 100 may be fabricated through a wafer-level process, the camera module 100 may be less contaminated, and process yield may increase.

Figure 12:
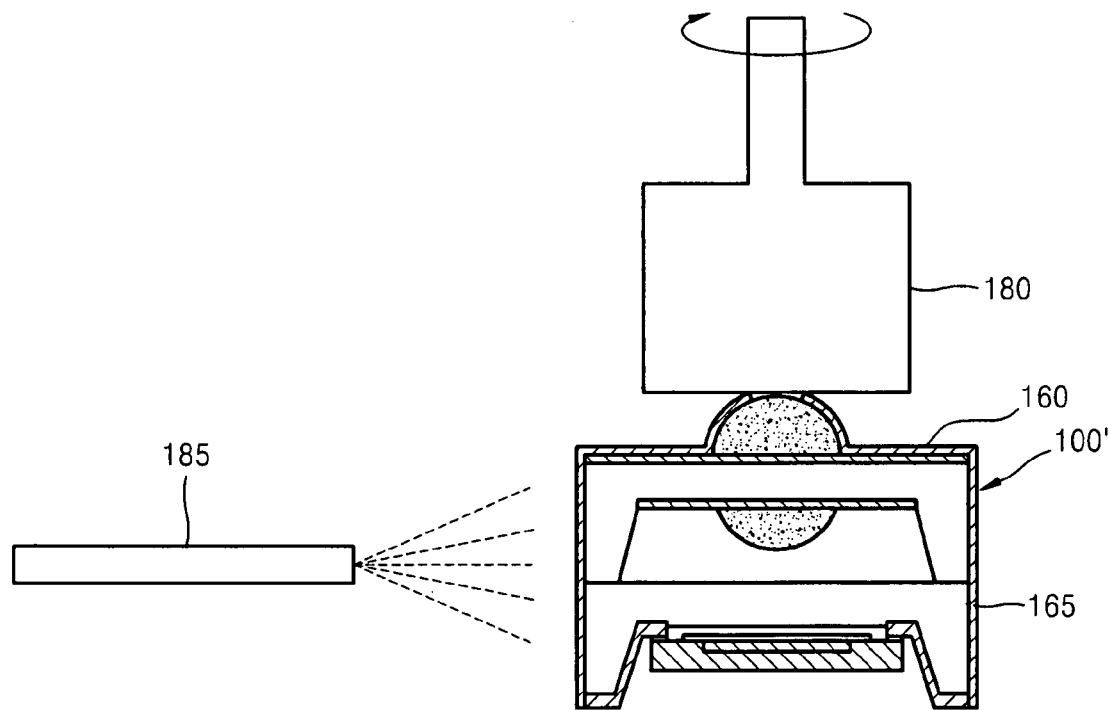
FIG. 12 is a cross-sectional view for explaining an example embodiment method of fabricating a camera module.

FIG. 12 is a cross-sectional view illustrating an example embodiment method of fabricating a camera module. An example embodiment method of fabricating the camera module may include the operations illustrated in FIGS. 3 through 11.

As shown in FIG. 12, an additional stop member 165 may be formed on sidewalls of the semiconductor package 120 and/or the transparent substrate 140 fabricated by the process of FIG. 11. Stop members 160 and 165 may be referred to as a first and second stop members, respectively. After fixing the stacked structure of the semiconductor package 120 and/or the transparent substrate 140 using a vacuum collet jig 180, a sidewall of the semiconductor package 120 and/or the transparent substrate 140 may be coated with a black material, for example, photoresist, using a nozzle 185 so as to form the stop member 165. Second stop members 165 may be substantially uniformly formed on sidewalls of the semiconductor package 120 and/or the transparent substrate 140 by rotating the vacuum collet jig 180.

As described above, example embodiment camera modules may have a compact and integrated stack structure as compared with a conventional camera module in which components may be separately assembled. In the example embodiment camera module, the lens member, the filter members, and the stop member may be formed very close to each other, and the camera module may have a smaller size. The camera module may include a high-resolution lens member, and/or light may be effectively blocked by adjusting the stop member.

Example embodiment camera modules may be fabricated at a wafer level. Manufacturing costs may be reduced by simultaneously fabricating the camera modules at a wafer level. Example embodiment camera modules may have a significantly reduced size by fabricating the camera module at a wafer level as compared with a related art camera module in which components may be individually assembled. Because example embodiment camera modules may be formed through the wafer-level process, the camera module may be less contaminated, and/or process yield may increase.

While example embodiments have been particularly shown and described, it will be understood by those of ordinary skill in the art that various changes in form and details may be made therein without departing from the spirit and scope of the following claims.

What is claimed is:

1. A camera module comprising:
   an image sensor chip;
   a transparent substrate having a cavity, an upper plate portion above the cavity, and a supporting portion around the cavity, the supporting portion being configured to attach to a semiconductor package housing the image sensor chip, and the upper plate portion being separated from the image sensor chip by the cavity; and
   a lens member attached to the upper plate portion of the transparent substrate.

2. The camera module of claim 1, wherein the lens member includes a first lens attached to a bottom side of the upper plate portion and a second lens attached to a top side of the upper plate portion.

3. The camera module of claim 2, wherein the first lens is in the cavity.

4. The camera module of claim 1, wherein the lens member includes an ultra-violet curable polymer.

5. The camera module of claim 1, further comprising:
   a stop member on the transparent substrate configured to limit exposure to a portion of the lens member.

6. The camera module of claim 5, wherein the stop member includes a photoresist layer configured to substantially block light.

7. The camera module of claim 5, wherein the stop member extends onto at least one sidewall of the semiconductor package and the transparent substrate.

8. The camera module of claim 1, further comprising:
   a filter member between the transparent substrate and the lens member.

9. The camera module of claim 1, wherein the transparent substrate includes a glass substrate.

10. A camera module comprising:
    a transparent substrate having a first side, a second side opposite the first side, and a supporting portion under the second side, the supporting portion configured to attach to a semiconductor package;
    a first lens attached to the first side of the transparent substrate; and
    a second lens attached to the second side of the transparent substrate and aligned with the first lens.

* * * * *